United States Patent
Chen et al.

(10) Patent No.: US 6,211,728 B1
(45) Date of Patent: Apr. 3, 2001

(54) MODULATION SCHEME FOR FILTERLESS SWITCHING AMPLIFIERS

(75) Inventors: Wayne Tien-Feng Chen, Plano; Marco Corsi, Parker; Roy Clifton Jones, III, Dallas; Michael David Score, Richardson, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/441,619

(22) Filed: Nov. 16, 1999

(51) Int. Cl.[7] ........................................ H03F 3/38
(52) U.S. Cl. .................. 330/10; 330/251; 330/146
(58) Field of Search ........................ 330/10, 207 A, 330/251, 146; 363/41

(56) References Cited

U.S. PATENT DOCUMENTS

| | | | |
|---|---|---|---|
| 4,554,215 | * 11/1985 | Aiello | 330/10 |
| 4,673,889 | * 6/1987 | Cini et al. | 330/10 |
| 6,016,075 | * 1/2000 | Hamo | 330/10 |
| 6,028,476 | * 2/2000 | Schweighofer | 330/10 |
| 6,034,565 | * 3/2000 | Schweighofer | 330/10 |

\* cited by examiner

Primary Examiner—Robert Pascal
Assistant Examiner—Henry Choe
(74) Attorney, Agent, or Firm—Wade James Brady III; Frederick J. Telecky, Jr.

(57) ABSTRACT

A Class-D switching amplifier (20) having a terinary modulation scheme implemented in an H-bridge configuration. The present invention has four states of operation, and achieves increased efficiency and reduced cost by delivering current to the load only when needed, and once delivered, maintaining the current. The Class-D switching amplifier eliminates the need for post amplifier filters.

20 Claims, 3 Drawing Sheets

MODULATION SCHEME FOR FILTERLESS SWITCHING AMPLIFIERS

CROSS REFERENCE TO RELATED APPLICATIONS

Cross-reference is made to commonly assigned patent application entitled "Concept and Methods to Enable Filterless, Efficient Operation of Class-D Amplifiers," filed herewith, the teaching of which are incorporated herein by reference.

Field of the Invention

The present invention is generally related to switching amplifier circuits, and more particularly to Class-D amplifiers.

BACKGROUND OF THE INVENTION

Switching amplifiers, also know as Class-D amplifiers as the name implies, have an output that is switched or pulse-width modulated (PWM) at a frequency much higher than the frequency of interest. For example, in audio applications, these amplifiers will switch at typical frequencies of 250 kHz, while the audio band is limited to 20 kHz. These amplifiers are analogous to switching regulators, and receive similar benefits and disadvantages of such devices when compared to their linear counterparts. The main advantage of these switching amplifiers is their efficiency and its derivatives, i.e., lower thermal dissipation, battery life, smaller power supplies, size, weight, etc. The main disadvantage is cost and complexity.

Present modulation schemes utilizing either half or full H-bridge output stage topologies which switch in a "binary" fashion. In such a switching method, there are two valid states for the bridge, neglecting dead time, which are shown at 10 in FIG. 1 and FIG. 2. Although simpler to implement, the disadvantage of this solution is that there is always a current 12 provided to the load due to the voltage differential always provided across nodes OUTP and OUTN, shown at 14, illustrated in FIG. 3. For operation near zero crossing, or no audio signal, the majority of the current used is wasted, and is a drop in efficiency. As shown in FIG. 3, an output squarewave with a 50% duty cycle will spend 50% of the time period decaying the current in the inductor, and 50% of the period to re-establish the current in the opposite direction, this resulting in a time averaged current of zero.

Furthermore, this will require that the load be inductive. Consider a pure resistive load. Switching the H-bridge in a "binary" fashion would place the power supply voltage across the load (plus parasitics of the switch). Unlike the current waveform 12 shown in FIG. 3, the resulting current would be a squarewave with a magnitude equal to the power supply divided by the resistance of the load. For example, an H-bridge using a 5V supply driving a 40Ω load would see a current of about 1 Amp, and this is with no signal. Although the electrical equivalent of a speaker is somewhere between purely resistive and purely inductive, this would still prevent filterless operation of Class-D amplifiers in audio applications as the main benefit of efficiency is lost. Today, the problem is solved by providing some current limiting device in series with the speaker, usually a post-filter comprised of inductors and thereby creating a current flow shown at 12 in FIG. 3. The typical circuit topology is shown at 16 in FIG. 4.

SUMMARY OF THE INVENTION

The present invention acheives technical advantages as a circuit and a method achieving filterless Class-D operation, increased efficiency, and reduced cost by delivering current to the load only when needed, and once delivered, maintain the current by not decaying or wasting energy in removing the current. This is accomplished by using a terinary modulation scheme. This scheme is implemented in an H-bridge configuration, where there are four states of operation as the scheme implies. The modulation scheme generates PWM signals, whereby the edges of the voltage signal at a node OUTP move away from each other, and the edges of the voltage signal at a node OUTN move towards each other. The voltage difference of these two signals, which appears across the load, is narrow pulses. These pulses also have the desired affect of doubling the single-ended PWM frequency.

The present invention allows for filterless operation of Class-D amplifiers, which becomes a huge cost, board, and implementation savings. Cost of a filter for Class-D amplifier at least matches silicon cost, thus making Class-D solutions at least 2× solution cost more than their linear counterparts. Eliminating the filter is currently the only way to be cost competitive with linear amplifiers. Also, the modulation scheme allows for higher efficiency and reduced board space, where fractions of the filter can be used.

BRIEF DESCRIPTION OF THE DRAWINGS

Other aspects of the invention including specific embodiments are understood by reference to the following detail description taken in conjunction with the detail drawings in which:

FIG. 6 is a schematic diagram of the present invention shown in FIG. 5 illustrating a fourth state of operation of the present invention, also generating no voltage differential across the load, and thus no current through;

DETAILED DESCRIPTION OF PREFERRED EMBODIMENTS

Figure 1:
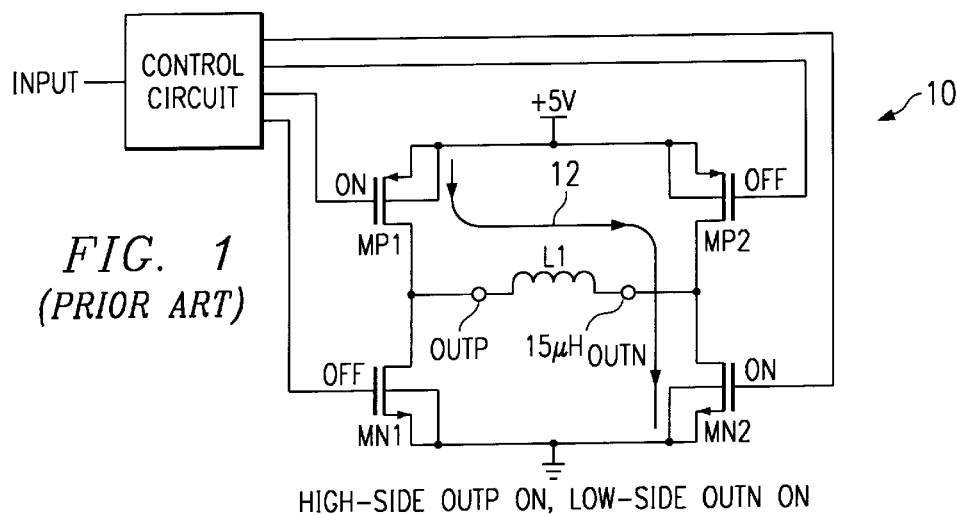
FIG. 1 is a schematic diagram of a prior art Class-D switching amplifier operating in binary fashion depicting a first state of operation.
Figure 2:
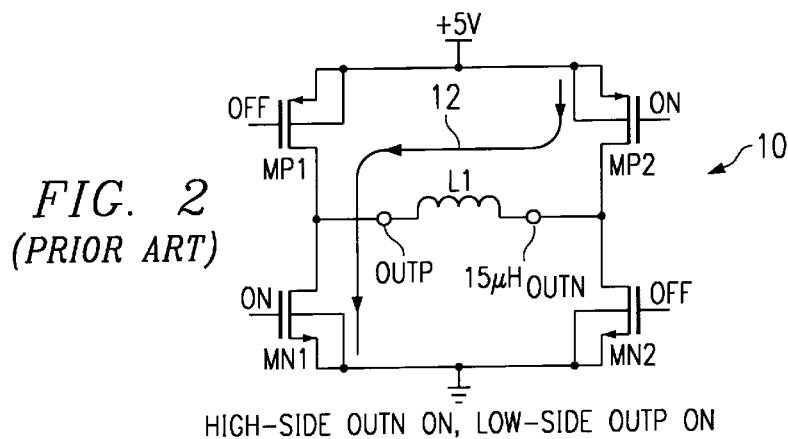
FIG. 2 is a schematic diagram of the Class-D switching amplifier shown in FIG. 1 depicting the second state of operation.
Figure 3:
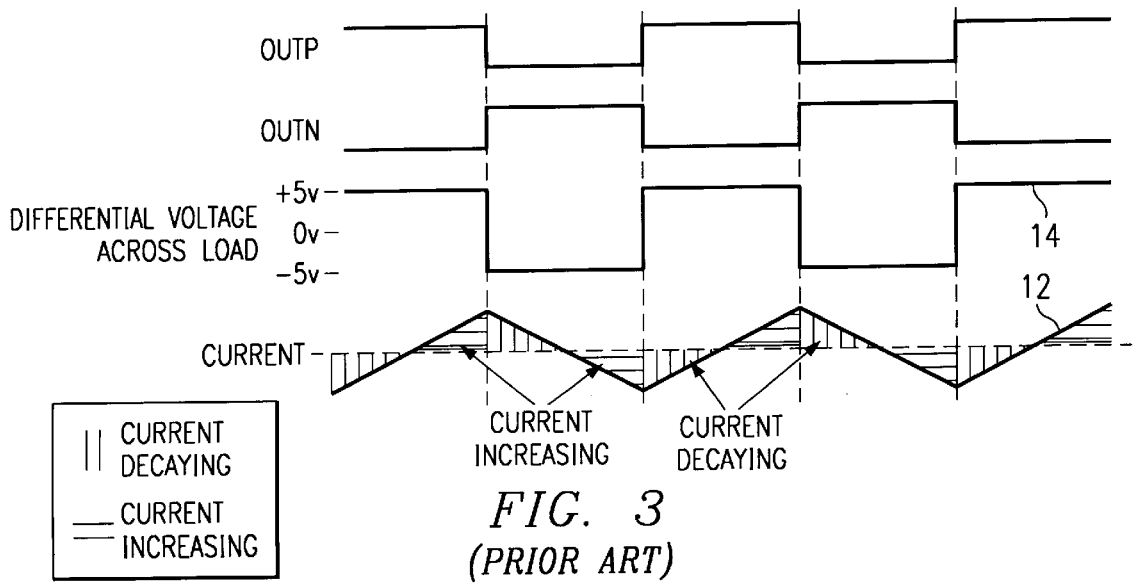
FIG. 3 is a signaling diagram illustrating the voltage signals provided to the output terminals, a differential voltage delivered across the load, and the current conducted through the load.
Figure 4:
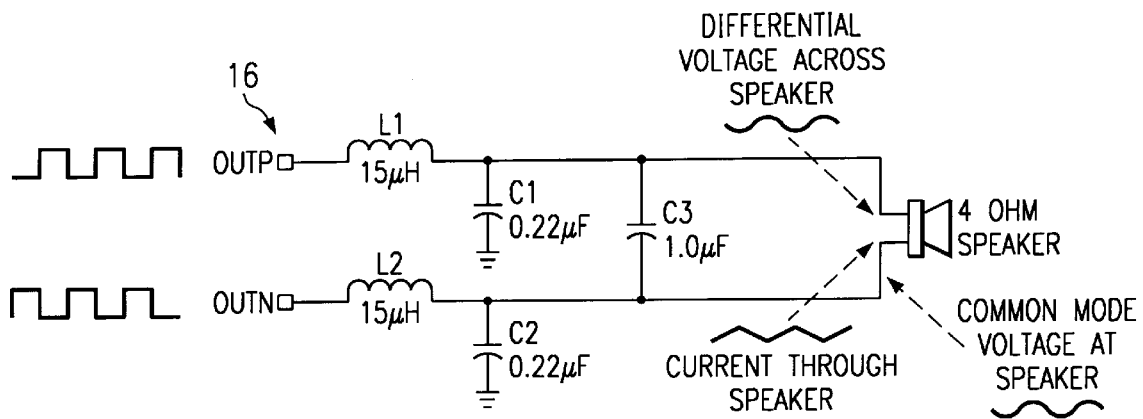
FIG. 4 is a schematic diagram of a typical post filter for the "binary" modulation scheme.
Figure 5:
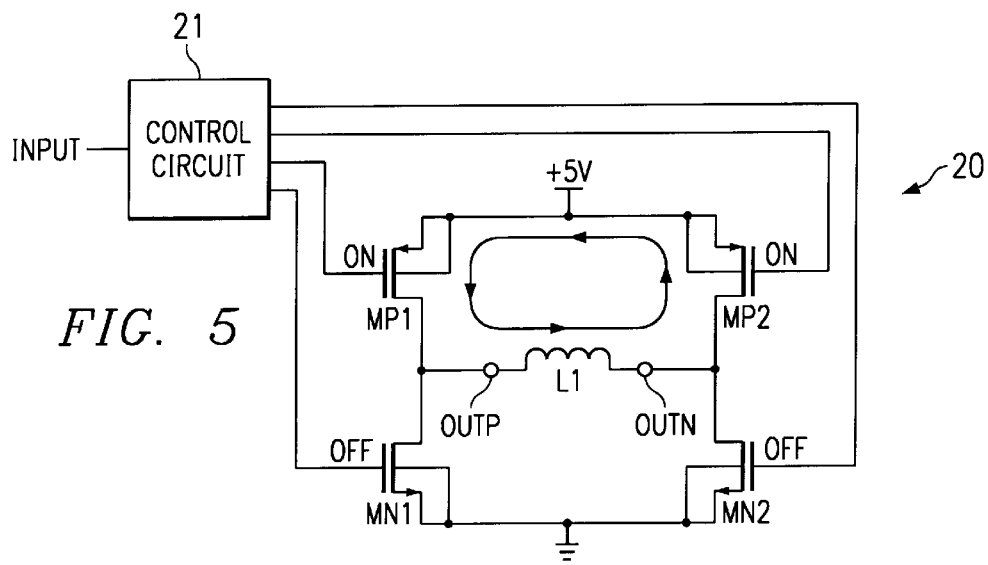
FIG. 5 is a schematic diagram of a third state of operation of the present invention generating no voltage differential across the load.
Figure 6:
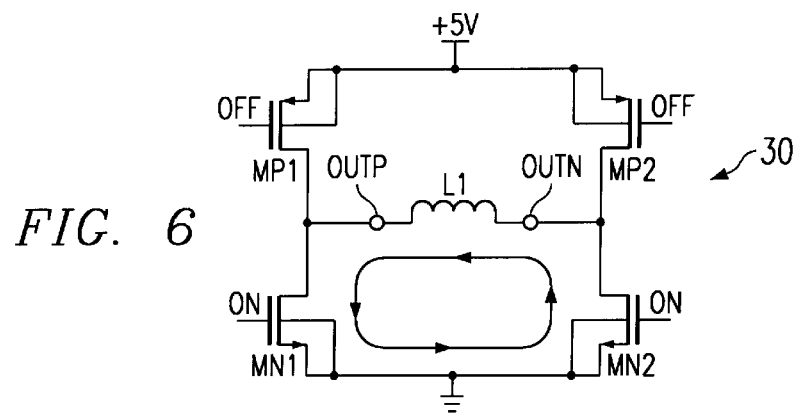

The present invention achieve technical advantages as a Class-D switching amplifier having four states of operation, the first two states being shown in FIG. 1 and FIG. 2, a third state of operation shown in FIG. 5 at 20 and a fourth state of operation shown at 30 in FIG. 6.

Figure 7:
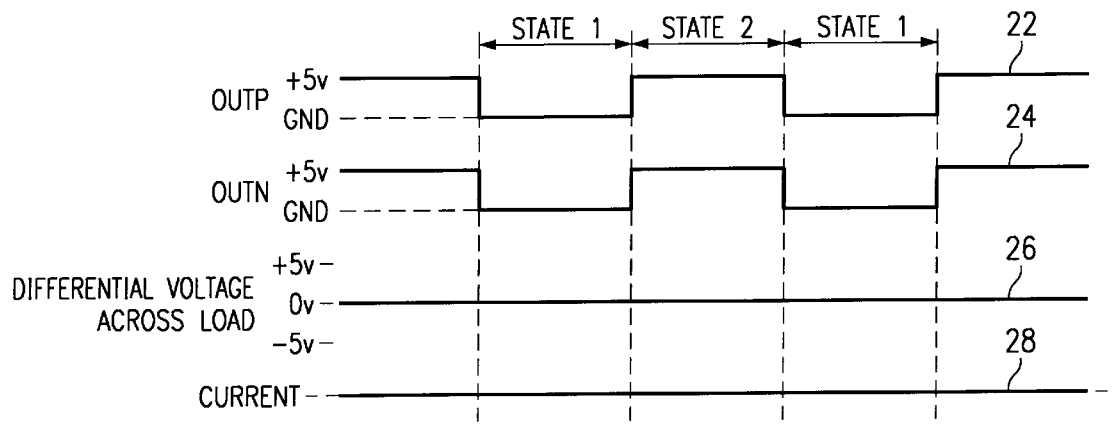
FIG. 7 is a timing diagram illustrating the voltage signals at the output terminals, the differential voltage across the load and the current conducted through the load for the states of operation shown in FIG. 5 and FIG. 6.
Figure 8:
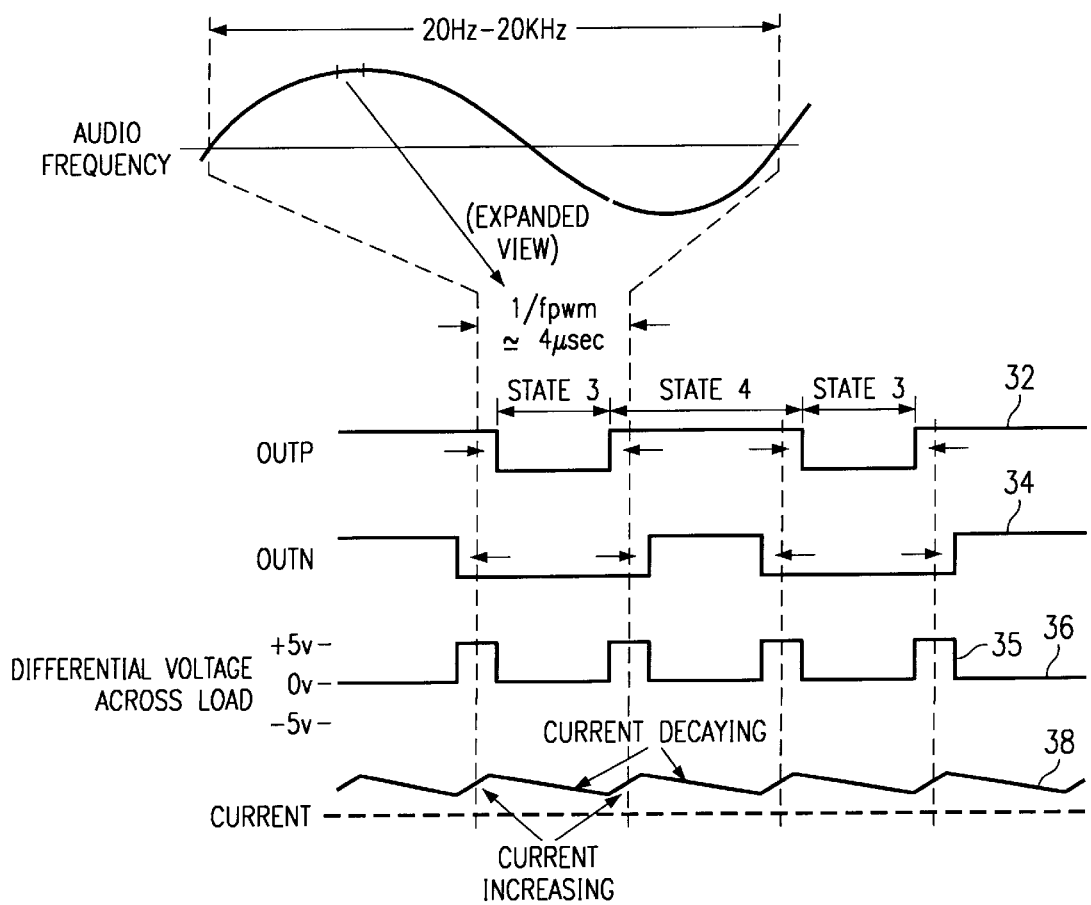
FIG. 8 is a timing diagram of the present invention corresponding to the third and fourth states of operation depicted in FIG. 5 and FIG. 6 illustrating a differential voltage being generated across the load, and thus, a corresponding current.

Referring to FIG. 7 and FIG. 8, there is shown two states of a terinary modulation scheme, a generated differential output voltage, and current waveforms according to the preferred embodiment of the present invention. As shown in FIG. 5, controlling voltage signals controllably are provided by control circuit 21 to the four switching MOS transistors MP1, MN1, MP2, and MN2 in a switching sequence so as to alternate between the first state of operation shown in FIG. 1, the second state of operation shown in FIG. 2, the third state of operation shown in FIG. 5 and the fourth state of operation shown in FIG. 6.

As shown in FIG. 7, a voltage waveform 22 and a voltage waveform 24 provided by the switches to the output terminals OUTP and OUTN, respectively, and are in phase and correspond to one another in state 1 and state 2, thereby generating no differential voltage across the load as shown at 26, and thus, generating no current through the load as shown as 28.

Referring now to FIG. 8, when it is desired to deliver current to the load corresponding to an input signal provided to control circuit 21, the control signals provided to the gates of the four switching MOS transistors MP1, MN1, MP2, and MN2 by controller 21 operate the switching circuit in states 3 and 4 as shown in FIG. 5 and FIG. 6, whereby this is done by moving the edges of the voltage signal 32 at terminal OUTP away from each other, and the edges of the voltage signal 34 towards each other. The difference of these two signals provided between output terminals OUTP and OUTN appear across the load L1 as narrow pulses, depicted at 35 of waveform 36. These pulses 35 have the desired effect of doubling the single-ended PWM frequency. Current does decay as the speaker and MOS switches MN1, MN2, MP1 and MP2 have resistive components that are lossy.

The Class-D amplifier and method of operation thereof achieves technical advantages as a filterless Class-D operation that has increased efficiency, and reduced cost by delivering current to the load only when needed, and furthermore, when once delivered, maintaining the current by reducing the rate of decay or decreasing the waste of energy in removing the current. The present invention achieves this using the terinary modulation scheme implemented in a H-bridge configuration having four states of operation, as shown in FIG. 1, FIG. 2, FIG. 5, and FIG. 6.

The present invention allows for filterless operation of Class-D amplifiers, which is a huge savings for design and component implementation. The present invention allows the cost of the improved Class-D amplifier to be more in line with the costs of linear counterpart. The present invention eliminates the need for post switching circuit filters and is thus cost competitive with the linear amplifiers. The terinary modulation scheme allows for higher efficiency and reduced board space.

While the invention has been described in conjunction with preferred embodiments, it should be understood that modifications will become apparent to those of ordinary skill in the art and that such modifications are therein to be included within the scope of the invention and the following claims.

We claim:

1. A Class-D switching amplifier, comprising:
a first, second, third and fourth switch each having a respective control terminal, a first output terminal disposed between said first switch and said second switch, and a second output terminal disposed between said third switch and said fourth switch; and
a control circuit coupled to each said control terminals and pulse and width modulating (PWM) said four switches such that no voltage differential is generated between said first output terminal and said second output terminal in a first state of operation for a first predetermined time period.

2. The Class-D amplifier as specified in claim 1 wherein said control circuit PWM controls said four switches such that a differential voltage is generated between said first output terminal and said second output terminal in a third state of operation for a second predetermined time period.

3. The Class-D switching amplifier as specified in claim 2 wherein a current delivered to a load connected between said first output terminal and said second output terminal directly corresponds to the differential voltage therebetween.

4. The Class-D switching amplifier as specified in claim 2 wherein the ratio of the first predetermined time period to the second predetermined time period is correlated to the voltage potential generated between the first and second output terminals.

5. The Class-D switching amplifier as specified in claim 2 wherein the control circuit PWM controls said four switches in a second state generating no said voltage differential between said first output terminal and said second output terminal, and a fourth state generating a voltage differential between said first output terminal and said second output terminal, said switches being controlled differently in said first state than said third state, and said switches being controlled differently in said second state than said fourth state.

6. The Class-D switching amplifier as specified in claim 4 wherein the average voltage provided across the first and second output terminals is a function of the ratio of the first predetermined time period to the second predetermined time period.

7. The Class-D switching amplifier as specified in claim 2 further comprising a load coupled between said first and second output terminals.

8. The Class-D switching amplifier as specified in claim 7 wherein said load has an inductive component.

9. The Class-D switching amplifier as specified in claim 8 wherein said load is inductive.

10. The Class-D switching amplifier as specified in claim 1 wherein the first and second switch are coupled in series between a first voltage potential and a second voltage potential, and said third switch and said fourth switch are coupled in series between said first voltage potential and said second voltage potential.

11. A Class-D switching amplifier, comprising:
a first switch and a second switch coupled in series between a first voltage potential and a second voltage potential, a third switch and a fourth switch coupled in series between said first voltage potential and said second voltage potential, a first output terminal defined between said first and second switches, a second output terminal defined between said third and fourth switches, each said switch having a control terminal; and
a control circuit coupled to each said control terminals pulse width modulating (PWM) said four switches such that no voltage differential is generated between said first output terminal and said second output terminal in a first state of operation for a first predetermined time period.

12. The Class-D switching amplifier as specified in claim 11 wherein said control circuit PWM controls said four switches such that a differential voltage is generated between said first output terminal and said second output terminal in a second state of operation for a second predetermined time period.

13. The Class-D switching amplifier as specified in claim 12 wherein a current delivered to a load connected between said first output terminal and said second output terminal directly corresponds to the differential voltage therebetween.

14. The Class-D switching amplifier as specified in claim 12 wherein the ratio of the first predetermined time period to the second predetermined time period is correlated to the voltage potential generated between the first and second output terminals.

15. The Class-D switching amplifier as specified in claim 12 wherein the control circuit PWM controls said four switches in a second state generating no said voltage differential between said first and second output terminals, and a fourth state generating a voltage differential between said first and second output terminals, said switches being controlled differently in said first state than said second state, and being controlled differently in said third state than said fourth state.

16. The Class-D switching amplifier as specified in claim 14 wherein the average voltage provided across the first and second output terminals is a function of the ratio of the first predetermined time period to the second predetermined time period.

17. The Class-D switching amplifier as specified in claim 12 further comprising a load coupled between said first and second output terminals.

18. The Class-D switching amplifier as specified in claim 17 wherein said load has an inductive component.

19. The Class-D switching amplifier as specified in claim 18 wherein said load is inductive.

20. The Class-D switching amplifier as specified in claim 18 wherein the second voltage potential is ground and the first voltage potential is positive with respect to ground.

* * * * *

(12) EX PARTE REEXAMINATION CERTIFICATE (8646th)
United States Patent
Chen et al.

(10) Number: US 6,211,728 C1
(45) Certificate Issued: Nov. 1, 2011

(54) MODULATION SCHEME FOR FILTERLESS SWITCHING AMPLIFIERS

(75) Inventors: Wayne Tien-Feng Chen, Plano, TX (US); Marco Corsi, Parker, TX (US); Roy Clifton Jones, III, Dallas, TX (US); Michael David Score, Richardson, TX (US)

(73) Assignee: Texas Instruments, Inc., Dallas, TX (US)

Reexamination Request:
No. 90/010,558, May 28, 2009

Reexamination Certificate for:
Patent No.: 6,211,728
Issued: Apr. 3, 2001
Appl. No.: 09/441,619
Filed: Nov. 16, 1999

(51) Int. Cl.
*H03F 3/217* (2006.01)
*H03F 3/20* (2006.01)

(52) U.S. Cl. .................. 330/10; 330/251; 330/146
(58) Field of Classification Search .............. None
See application file for complete search history.

(56) References Cited

To view the complete listing of prior art documents cited during the proceeding for Reexamination Control Number 90/010,558, please refer to the USPTO's public Patent Application Information Retrieval (PAIR) system under the Display References tab.

*Primary Examiner*—Margaret Rubin

(57) ABSTRACT

A Class-D switching amplifier (20) having a terinary modulation scheme implemented in an H-bridge configuration. The present invention has four states of operation, and achieves increased efficiency and reduced cost by delivering current to the load only when needed, and once delivered, maintaining the current. The Class-D switching amplifier eliminates the need for post amplifier filters.

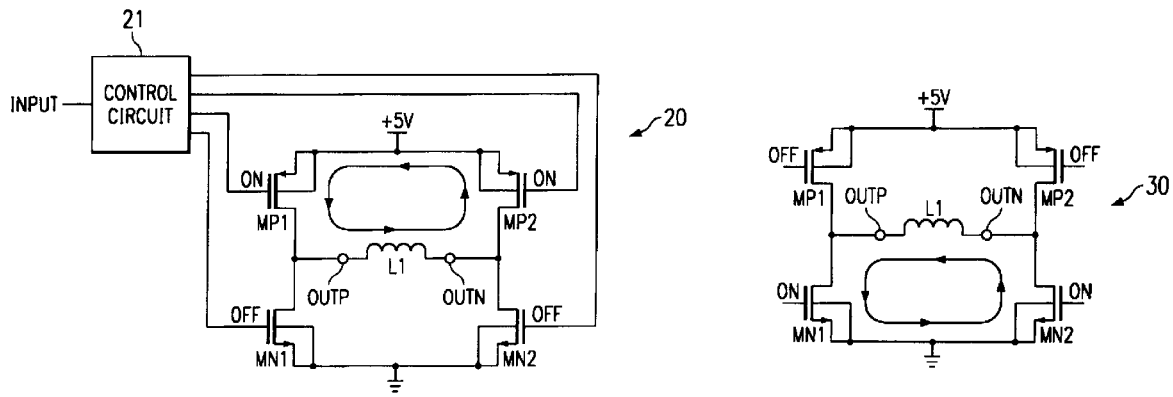

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-20 are cancelled.

* * * * *